(12) United States Patent
Luo et al.

(10) Patent No.: US 12,048,131 B2
(45) Date of Patent: Jul. 23, 2024

(54) DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yonghui Luo, Beijing (CN); Binfeng Feng, Beijing (CN); Jiaxiang Wang, Beijing (CN); Ying Liu, Beijing (CN); Hailong Ran, Beijing (CN); Fei Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 575 days.

(21) Appl. No.: 17/298,463

(22) PCT Filed: Aug. 25, 2020

(86) PCT No.: PCT/CN2020/111040
§ 371 (c)(1),
(2) Date: May 28, 2021

(87) PCT Pub. No.: WO2022/040906
PCT Pub. Date: Mar. 3, 2022

(65) Prior Publication Data
US 2022/0322585 A1     Oct. 6, 2022

(51) Int. Cl.
H05K 9/00 (2006.01)
H05K 5/00 (2006.01)

(52) U.S. Cl.
CPC ......... *H05K 9/0079* (2013.01); *H05K 5/0017* (2013.01); *H05K 9/0054* (2013.01)

(58) Field of Classification Search
None
See application file for complete search history.

(56) References Cited

U.S. PATENT DOCUMENTS

2022/0377908 A1*  11/2022  Kim .................. H05K 3/288

FOREIGN PATENT DOCUMENTS

| CN | 104835804 A | 8/2015 |
|----|-------------|--------|
| CN | 107482041 A | 12/2017 |

(Continued)

OTHER PUBLICATIONS

PCT International Search Report, Application No. PCT/CN2020/111040, dated May 12, 2021, 7 pages: with English translation.
(Continued)

*Primary Examiner* — Ashok Patel
(74) *Attorney, Agent, or Firm* — Armstrong Teasdale LLP

(57) ABSTRACT

The present disclosure relates to a display device. The display device includes a display panel having a display side and a non-display side opposite to the display side, a first conductive supporting portion located on the non-display side of the display panel, a second conductive supporting portion located on a side of the first conductive supporting portion away from the display panel, a bonding portion between the first conductive supporting portion and the second conductive supporting portion, and a conductive connecting portion for electrically connecting the first conductive supporting portion and the second conductive supporting portion.

19 Claims, 4 Drawing Sheets

(56) References Cited

FOREIGN PATENT DOCUMENTS

| | | |
|---|---|---|
| CN | 110400520 A | 11/2019 |
| CN | 110718156 A | 1/2020 |
| CN | 111179759 A | 5/2020 |
| CN | 210836911 U | 6/2020 |
| CN | 111429807 A | 7/2020 |

OTHER PUBLICATIONS

PCT Written Opinion, Application No. PCT/CN2020/111040, dated May 12, 2021, 7 pages.: with English translation of relevant part.

* cited by examiner

DISPLAY DEVICE

CROSS REFERENCE TO RELATED APPLICATIONS

This patent application is a National Stage Entry of PCT/CN2020/111040 filed on Aug. 25, 2020, the disclosure of which is incorporated by reference herein in its entirety as part of the present application.

BACKGROUND

The present disclosure relates to the technical field of displaying, and more particularly, to a display device.

The design of mobile phone gradually expands towards the direction of foldable, which brings new challenges for the design of the mobile phone screen.

BRIEF DESCRIPTION

Embodiments of the present disclosure provide a display device.

An embodiment of the present disclosure provides a display device. The display device includes a display panel having a display side and a non-display side opposite to the display side, a first conductive supporting portion located on the non-display side of the display panel, a second conductive supporting portion located on a side of the first conductive supporting portion away from the display panel, a bonding portion between the first conductive supporting portion and the second conductive supporting portion, and a conductive connecting portion for electrically connecting the first conductive supporting portion and the second conductive supporting portion.

In some embodiments, the bonding portion is conductive, and wherein the bonding portion and the conductive connecting portion are a same component.

In some embodiments, the bonding portion includes a conductive adhesive.

In some embodiments, the bonding portion is non-conductive, and wherein the conductive connecting portion includes a first portion located between the first conductive supporting portion and the second conductive supporting portion.

In some embodiments, the bonding portion has a first opening, and wherein the first portion of the conductive connecting portion is located in the first opening.

In some embodiments, the second conductive supporting portion has a second opening, wherein a projection of the second opening on the first conductive supporting portion overlaps with a projection of the first opening on the first conductive supporting portion, and wherein the conductive connecting portion further includes a second portion located in the second opening.

In some embodiments, wherein the first opening has a first dimension along a direction parallel to the first conductive supporting portion, and the second opening has a second dimension along the direction parallel to the first conductive supporting portion, wherein the first dimension is greater than the second dimension.

In some embodiments, the conductive connecting portion includes conductive glue, and wherein an applied amount of the conductive glue satisfies:

$$v \leq D*S \leq V \text{ and } S=(\rho_{after}-\rho_{before})/\rho_{after}\times 100\%,$$

wherein v is a volume of the first opening, V is a sum of the volumes of the first opening and the second opening, D is the applied amount of conductive adhesive, $\rho_{after}$ represents a density of the conductive adhesive after curing, and $\rho_{before}$ represents a density of the conductive adhesive before curing.

In some embodiments, the second conductive supporting portion includes a first sub-supporting portion and a second sub-supporting portion spaced apart from each other, and the conductive connecting portion includes a first sub-connecting portion and a second sub-connecting portion spaced apart from each other, wherein a projection of the first sub-connecting portion on the first supporting portion overlaps with a projection of the first sub-supporting portion on the first supporting portion, and wherein a projection of the second sub-connecting portion on the first supporting portion overlaps with a projection of the second sub-supporting portion on the first supporting portion.

In some embodiments, the display device is a foldable display device.

In some embodiments, a folding axis of the display device is located in a gap between the first sub-supporting portion and the second sub-supporting portion.

In some embodiments, the display device further includes a circuit board disposed on a side of at least one sub-supporting portion of the first sub-supporting portion and the second sub-supporting portion away from the first supporting portion, wherein a ground terminal of the circuit board is coupled to the at least one sub-supporting portion.

In some embodiments, the display panel includes a first sub-part and a second sub-part, wherein the first conductive supporting portion is provided on the first sub-part, the second sub-part is not provided with the first sub-part and bent toward the non-display side, and an end of the second sub-part away from the first sub-part is electrically coupled to the circuit board.

In some embodiments, the second sub-part of the display panel is bent so that the non-display side of the second sub-part of the display panel and the non-display side of the first sub-part of the display panel are opposite to each other.

In some embodiments, the display device further includes a first additional bonding portion located between the first conductive supporting portion and the display panel, a polarizer located on a side of the display panel away from the first conductive supporting portion, a second additional bonding portion located on a side of the polarizer away from the first conductive supporting portion, a cover layer located on a side of the second additional bonding portion away from the first conductive supporting portion.

In some embodiments, a material of the first conductive supporting portion and a material of the second conductive supporting portion include metal.

In some embodiments, the bonding portion includes a pressure sensitive adhesive.

BRIEF DESCRIPTION OF THE DRAWINGS

In order to explain the technical solutions of the embodiments of the present disclosure more clearly, the drawings of the embodiments will be briefly described below. It should be understood that the drawings described below only relate to some embodiments of the present disclosure, instead of being a limit to the present disclosure, in which.

DETAILED DESCRIPTION

Figure 1:
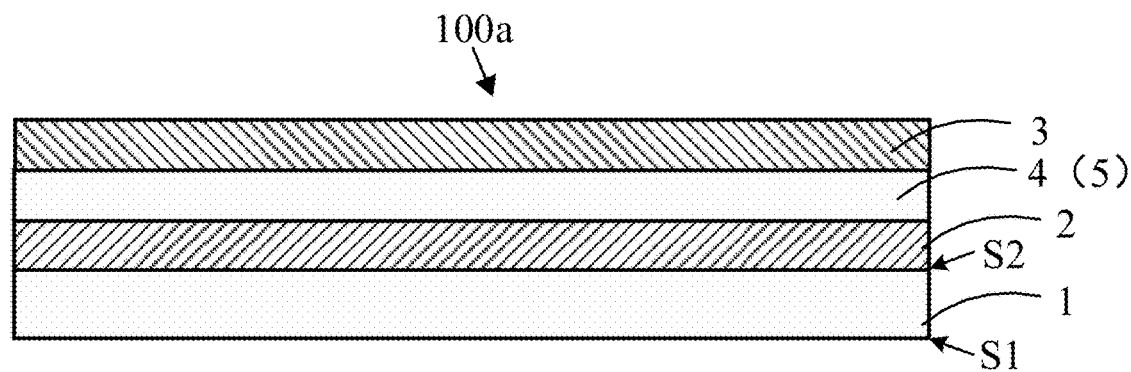
FIG. 1 is schematic view of a display device according to an embodiment of the present disclosure.

In order to make the technical solutions and advantages of the embodiments of the present disclosure clearer, the technical solutions of the embodiments of the present disclosure will be described clearly and completely in conjunction with the accompanying drawings. The described embodiments are part of the embodiments of the present disclosure, rather than all of the embodiments. Based on the described embodiments of the present disclosure, all other embodiments obtained by those skilled in the art without creative labor are also belonging to the protection scope of the present disclosure.

When the elements and the embodiments thereof of the present application are introduced, the articles "a/an", "one", "the" and "said" are intended to represent the existence of one or more elements. The expressions "comprise", "include", "contain" and "have" are intended as inclusive and mean that there may be other elements besides those listed.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected with or without any additional elements at the interface of the two elements.

In order to make the display device meet the folding requirements, it is necessary to prevent the film layer in the display device from wrinkling during folding. For this purpose, a support such as a steel sheet is needed on one side of the display device (for example, the non-display side). In addition, in order to facilitate the heat dissipation of the display device and further increase the mechanical strength of the display device, an additional support such as copper foil is needed on the steel sheet. However, static electricity occurs in the display device, and electrostatic discharge (ESD) can adversely affect the performance of the display device, and even damage the display device. Therefore, the display device shall meet the requirements of ESD protection while meeting the requirements of folding.

FIG. 1 is a schematic view of a display device 100a according to an embodiment of the present disclosure. As shown in FIG. 1, the display device 100a according to an embodiment of the present disclosure includes a display panel 1 having a display side S1 and a non-display side S2 opposite to the display side S1, a first conductive supporting portion 2 located on the non-display side S2 of the display panel 1, a second conductive supporting portion 3 located on a side of the first conductive supporting portion away from the display panel, a bonding portion 4 between the first conductive supporting portion 2 and the second conductive supporting portion 3, and a conductive connecting portion 5 for electrically connecting the first conductive supporting portion 2 and the second conductive supporting portion 3.

Through such arrangement, the first conductive supporting portion 2 and the second conductive supporting portion 3 are electrically connected to each other, which helps to ground the two at the same time, so as to release the static electricity generated in the display device in time, thereby protecting the display device and improving its stability and operating life. In addition, the first supporting portion and the second supporting portion can also increase the strength of the display device and improve the heat dissipation capacity.

As shown in FIG. 1, according to an embodiment of the present disclosure, the bonding portion 4 and the conductive connecting portion 5 may be the same component. In that case, the bonding portion 4 itself is conductive, thus the conductive connection function can also be additionally realized. In some embodiments, the bonding portion may include a conductive adhesive. For example, conductive glue can be used as the material of the bonding portion.

Figure 2A:
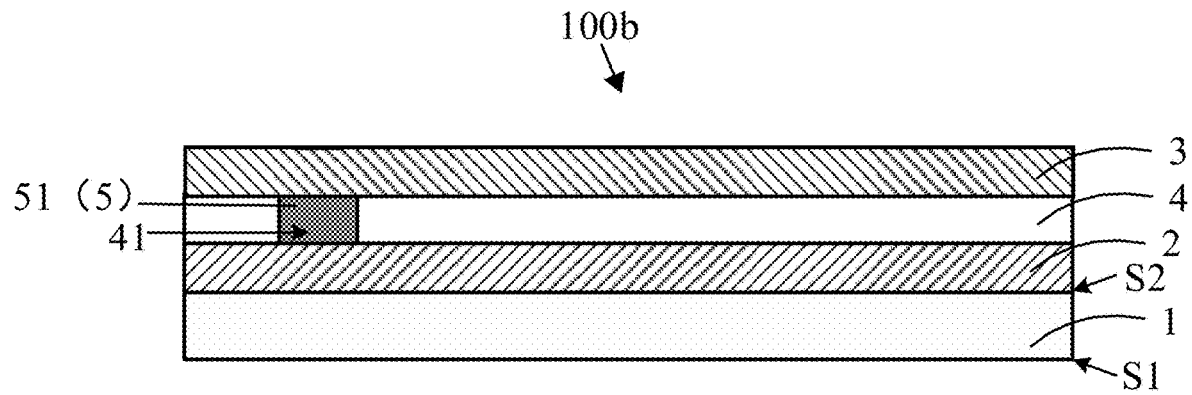
FIGS. 2A-2C are schematic views of a display device according to an embodiment of the present disclosure.

FIG. 2A is a schematic view of a display device 100b according to an embodiment of the present disclosure. The bonding portion 4 may be non-conductive. As shown in FIG. 2A, the conductive connecting portion 5 may include a first portion 51 located between the first conductive supporting portion 2 and the second conductive supporting portion 3. The bonding portion 4 may have a first opening 41. The first portion 51 of the conductive connecting portion 5 is located in the first opening 41.

Figure 2B:
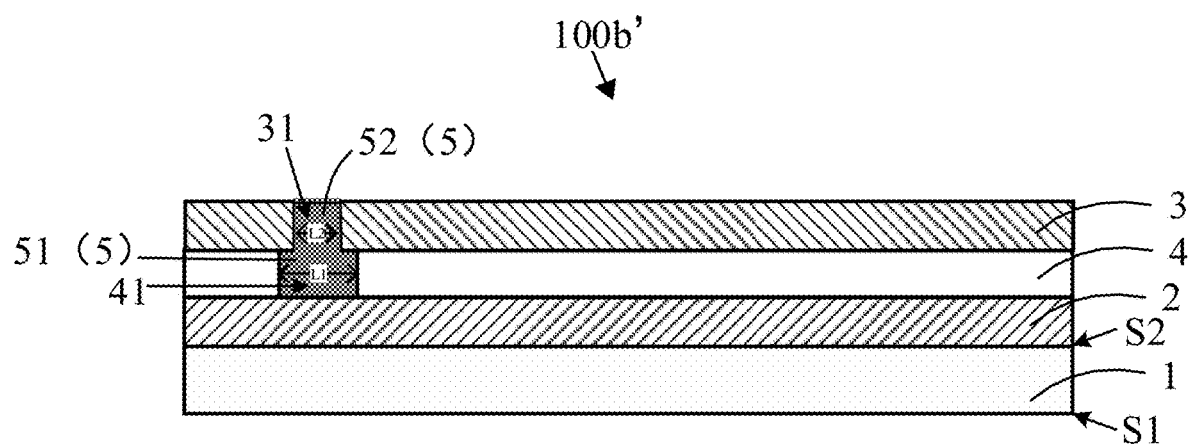

FIG. 2B is a schematic view of a display device 100b' according to an embodiment of the present disclosure. The difference between the display device 100b' and the display device 100b is that the second conductive supporting portion 3 has a second opening 31. A projection of the second opening 31 on the first conductive supporting portion 2 overlaps with a projection of the first opening 41 on the first conductive supporting portion 2. It should be noted that "overlap" here includes partial overlap and complete overlap. The conductive connecting portion 5 further includes a second portion 52 located in the second opening 31.

According to an embodiment of the present disclosure, the first opening 41 has a first dimension L1 in a direction parallel to the first conductive supporting portion 2, and the second opening 31 has a second dimension L2 in a direction parallel to the first conductive supporting portion 2. Size L2. The first dimension L1 may be set to be greater than the second dimension L2, so that a volume of the conductive connecting portion 5 and a contact area thereof with the first conductive supporting portion 2 can be increased. L1 can be adjusted according to the conductive effect and area, and L2 can be adjusted according to the process conditions.

Figure 2C:
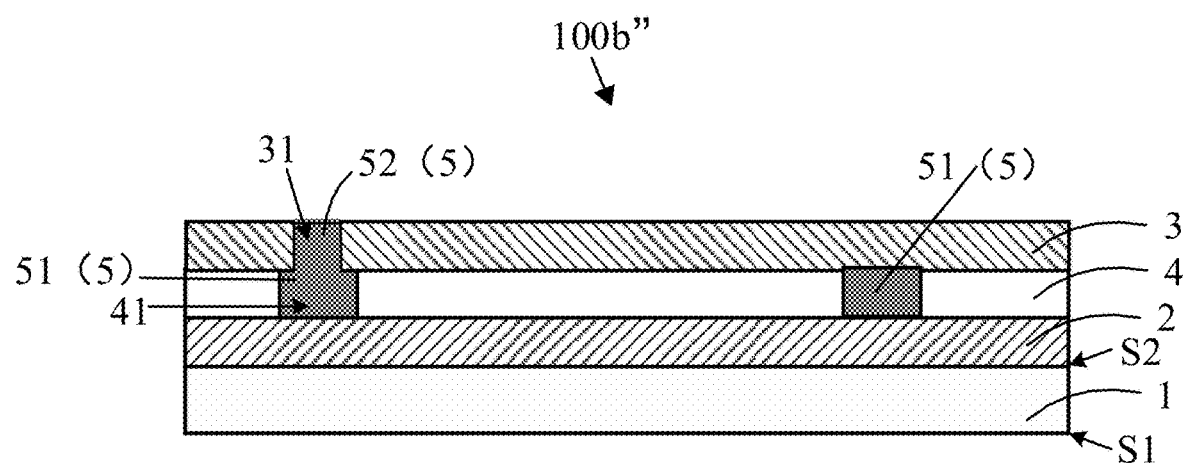

According to an embodiment of the present disclosure, the configurations of FIGS. 2A and 2B may exist in the display device at the same time. FIG. 2C is a schematic view of a display device 100b" according to an embodiment of the present disclosure. As shown in FIG. 2C, at the bonding portion position of the second conductive supporting portion 3 that does not have the second opening 31 (i.e., the position of the second conductive supporting portion 3 for attaching the conductive connecting portion 5), the conductive connecting portion 5 only has the first portion 51. At the bonding portion position of the second conductive supporting portion 3 having the second opening 31, the conductive connecting portion 5 includes a second portion 52 located in the second opening 31 in addition to the first portion 51.

Figure 3:
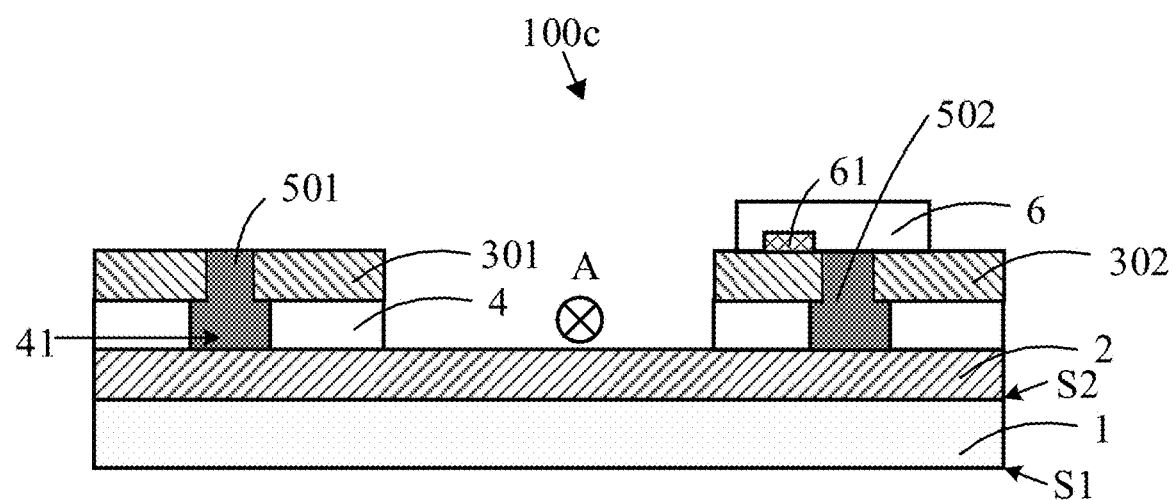
FIG. 3 is a schematic view of a display device according to an embodiment of the present disclosure.

FIG. 3 is a schematic view of a display device 100c according to an embodiment of the present disclosure. As shown in FIG. 3, the second conductive supporting portion 3 includes a first sub-supporting portion 301 and a second sub-supporting portion 302 that are spaced apart. The conductive connecting portion 5 includes a first sub-connecting portion 501 and a second sub-connecting portion 502 that are spaced apart. The projection of the first sub-connecting portion 501 on the first supporting portion 2 overlaps with the projection of the first sub-supporting portion 301 on the first supporting portion 2. The projection of the second sub-connecting portion 502 on the first supporting portion 2 overlaps with the projection of the second sub-supporting portion 302 on the first supporting portion 2.

The display device according to an embodiment of the present disclosure may be a foldable device. For example, as shown in FIG. 3, the folding axis A of the display device may be located in a gap between the first sub-supporting portion 301 and the second sub-supporting portion 302. By arranging the foldable area in the area between the first sub-supporting portion 301 and the second sub-supporting portion 302, the support of the display device in the foldable area can be lower than the support of the display device in the non-foldable area, benefiting the folding of the display device at the foldable area.

As shown in FIG. 3, the display device 100c according to an embodiment of the present disclosure may further include a circuit board 6. The circuit board 6 is arranged on a side of at least one supporting portion of the first sub-supporting portion 301 and the second sub-supporting portion 302 away from the first supporting portion 2. A ground terminal 61 of the circuit board 6 is coupled to the at least one supporting portion. For example, the circuit board 6 may be disposed on the second sub-supporting portion 302 and coupled to the second sub-supporting portion.

Figure 4:
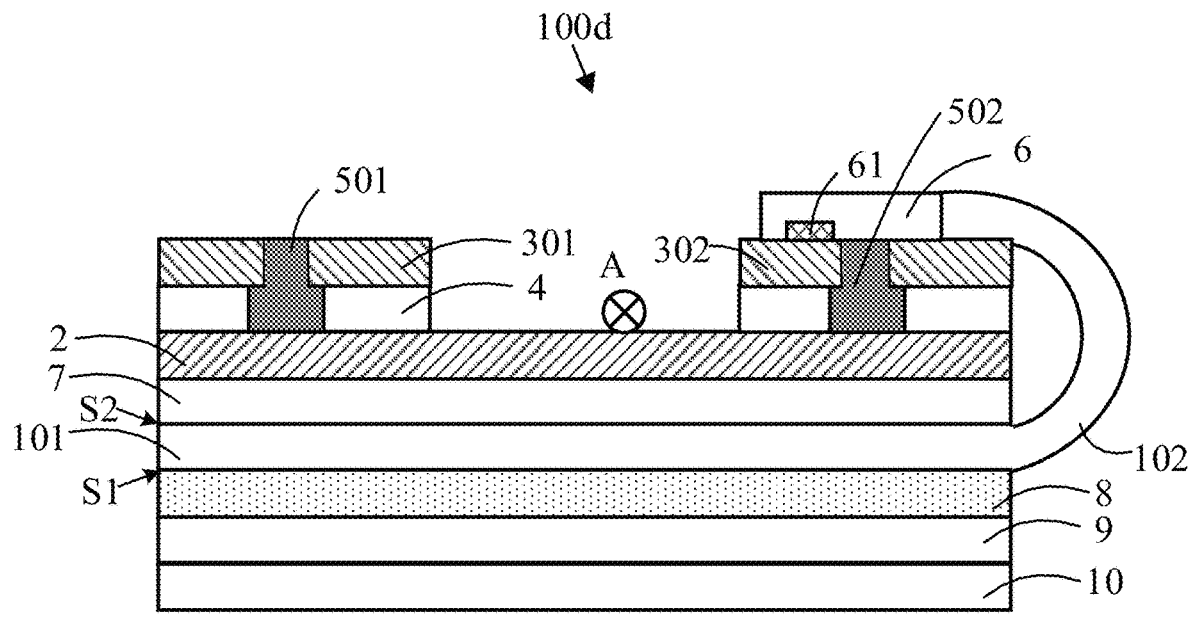
FIG. 4 is a schematic view of a display device according to an embodiment of the present disclosure.

FIG. 4 is a schematic view of a display device 100d according to an embodiment of the present disclosure. As shown in FIG. 4, the display panel 1 further includes a first sub-part 101 and a second sub-part 102. A first conductive supporting portion 2 is provided on the first sub-part 101. The first conductive supporting portion 2 is not provided on the second sub-part 102. Wherein, the second sub-part 102 is bent toward the non-display side, and an end of the second sub-part 102 away from the first sub-part is electrically coupled to the circuit board 6.

As shown in FIG. 4, the second sub-part 102 of the display panel 100d may be bent so that the non-display side S2 of the second sub-part 102 of the display panel and the non-display side S2 of the first sub-part of the display panel are opposite to each other. With such configuration, the circuit board 6 does not occupy the area of the bezel region, thereby reducing the bezel size of the display device, for example, realizing a bezel-less design of the display device.

As shown in FIG. 4, the display device 100d further includes a first additional bonding portion 7 located between the first conductive supporting portion 2 and the display panel 1, a polarizer 8, a second additional bonding portion 9 located on a side of the polarizer 8 away from the first conductive supporting portion 2, and a cover layer 10 located on a side of the second additional portion away from the first conductive supporting portion 2. The cover layer may function as a protective layer.

In some embodiments, the first conductive supporting portion and the second conductive supporting portion may include metal. For example, a material of the first conductive supporting portion may include at least one of steel and steel aluminum alloy. A material of the second conductive supporting portion may include at least one of copper and copper alloy. For example, the first conductive supporting portion may be a steel sheet, and the second conductive supporting portion may be a copper foil.

In some embodiments, the bonding portion 4 and the first additional bonding portion 7 may include a pressure sensitive adhesive.

Figure 5:
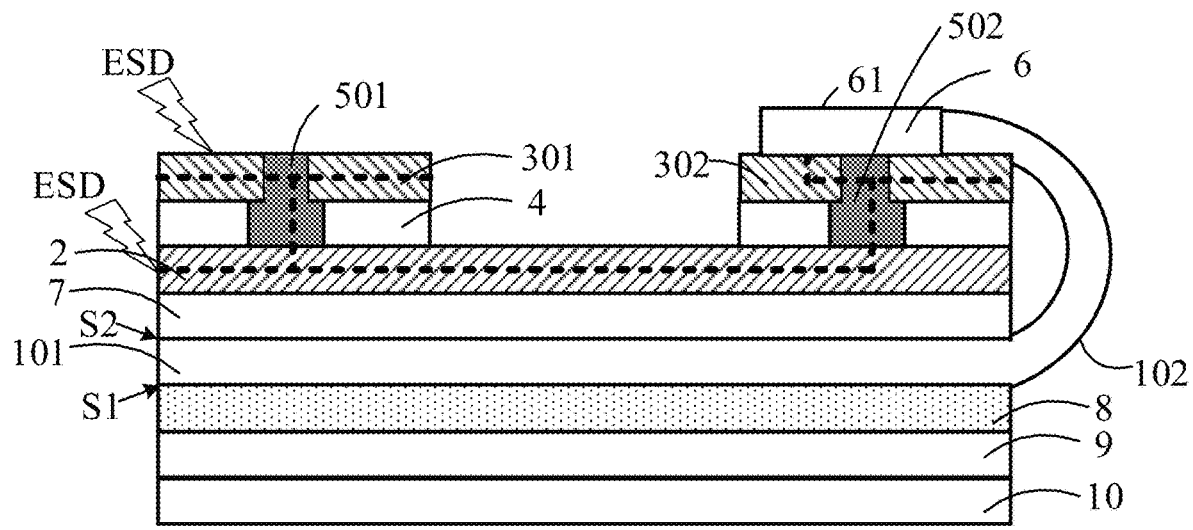
FIG. 5 is a schematic view of an electrostatic discharge of a display device according to an embodiment of the present disclosure.

FIG. 5 is a schematic view of electrostatic discharge of the display device according to an embodiment of the present disclosure. As shown in FIG. 5, when static electricity is generated at the first sub-supporting portion 301, the static electricity can be conducted from the first sub-supporting portion 301 to the first conductive supporting portion 2 through the first sub-connecting portion 501 of the conductive connecting portion 5, then to the second sub-connecting portion 502 and then to the ground terminal 61 of the circuit board 6. When static electricity is generated at the first supporting portion 2, the static electricity can be conducted to the ground terminal 61 of the circuit board 6 through the second sub-connecting portion 502. Thus, the generated static electricity can be eliminated.

The circuit board 6 may be FPCA (Flexible Printed Circuit Assembly), which may be connected to a main board or a middle frame (not shown) of a mobile phone. For example, the circuit board may be connected to an integrated circuit (IC) of a panel narrowing area 12 (see FIGS. 6 and 7). The integrated circuit may include an IC used for display and/or drive control, etc., which will not be described in detail here. The panel narrowing area 12 is used as a binding area of the display panel, which may be a part of the second sub-part 102 of the display panel 1.

Figure 6:
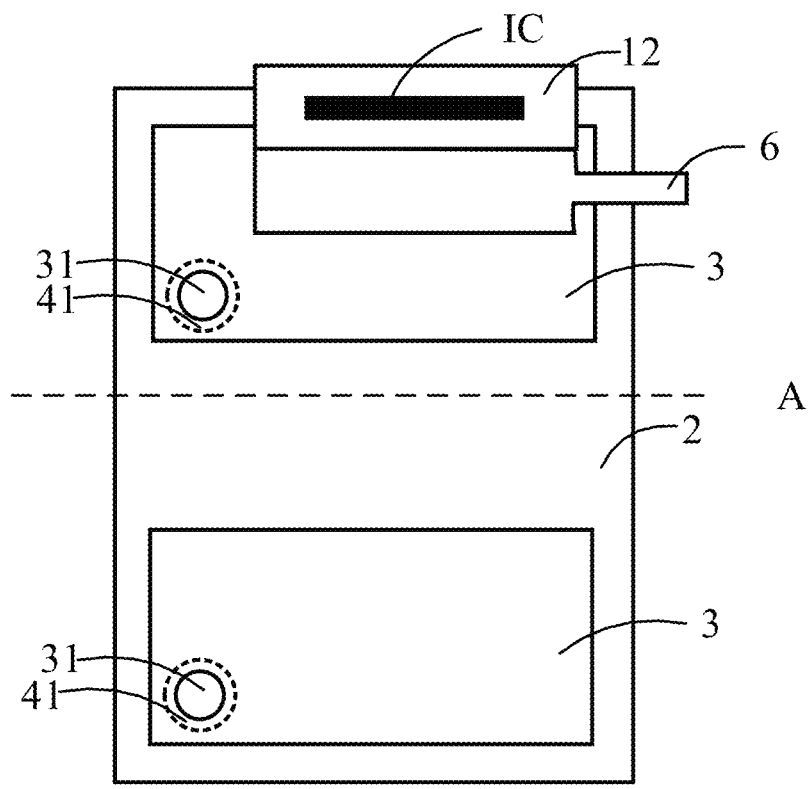
FIG. 6 is a schematic view of a display device according to an embodiment of the present disclosure.
Figure 7:
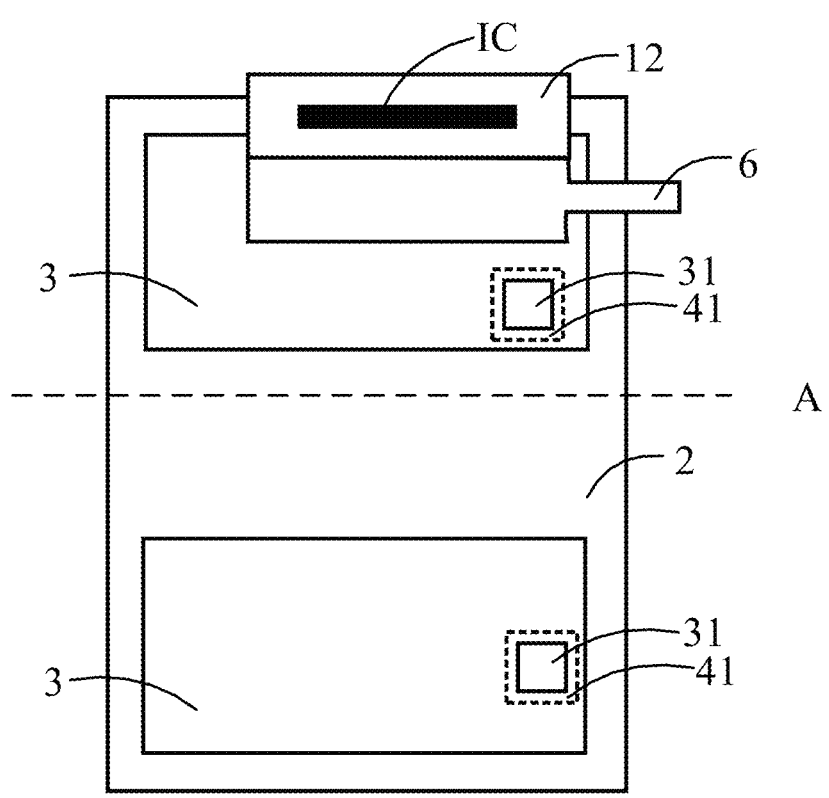
FIG. 7 is a schematic view of a display device according to an embodiment of the present disclosure.

FIGS. 6 and 7 are schematic views of display devices according to different embodiments of the present disclosure. The position, shape, and number of the first opening 41 and the second opening 31 can be set as required. As shown in FIG. 6, the shape of the first opening 41 and the second opening 31 may be circular. As shown in FIG. 7, the shape of the first opening 41 and the second opening 31 may be square. Although FIGS. 6 and 7 show that the shapes of the first opening 41 and the second opening 31 are both circular or square, the shape of the first opening 41 and the shape of the second opening 31 may be different.

It should be understood that although the first sub-supporting portion and the second sub-supporting portion are shown as having openings in FIGS. 3-7, some embodiments of the present disclosure also include one or both of the first sub-supporting portion and the second sub-supporting portion do not have an opening. In that case, the configuration shown in FIG. 2A may be adopted for the bonding portion position of the sub-connecting portion without an opening, that is, the conductive connecting portion 5 only has the first portion 51. Besides, the same sub-connecting portion may include not only bonding portion positions with openings, but also bonding portion positions without openings.

In some embodiments, the second opening 31 may be formed in the second conductive supporting portion 3 such as copper foil, and the first opening 41 may be formed in the bonding portion 4 such as pressure sensitive adhesive, respectively. The second conductive supporting portion 3 formed with an opening is bonded to the bonding portion 4 formed with an opening. The bonded second conductive supporting portion 3 and the first conductive supporting portion 2 are bonded. Then, a conductive material is filled into the first opening and the second opening to form the conductive connecting portion 5.

For the case where the conductive material includes conductive glue, the application of the conductive material can follow the following formula:

$$v \leq D*S \leq V.$$

In this formula, v is a volume of the first opening 41, V is a sum of the volume of the first opening 41 and that of the second opening 31, D is the applied amount of conductive glue, and S is a shrinkage ratio of the conductive glue. $S=(\rho_{after}-\rho_{before})/\text{after } \rho \times 100\%$. Wherein, $\rho_{after}$ represents a density of the conductive adhesive after curing, and $\rho_{before}$ represents a density of the conductive adhesive before curing.

In some embodiments, a first additional bonding portion 7 may also be formed on the first conductive supporting portion 2.

In some embodiments, the display panel 1 may be attached to the polarizer 8, and then an additional bonding portion 9 is formed on a side of the polarizer 8 away from the display panel 1, and then a cover layer 10 is formed on a side of the additional bonding portion 9 away from the display panel 1.

Then, the display panel, the first conductive supporting portion, and the second conductive supporting portion can be combined to form a display device.

Certain specific embodiments have been described, and these embodiments are only shown by way of example and are not intended to limit the scope of the present disclosure. In fact, the novel embodiments described herein can be implemented in various other forms; in addition, various omissions, substitutions, and changes in the form of the embodiments described herein can be made without departing from the spirit of the present disclosure. The appended claims and their equivalents are intended to cover such forms or modifications that fall within the scope and spirit of the present disclosure.

What is claimed is:

1. A display device comprising:
    a display panel having a display side and a non-display side opposite to the display side;
    a first conductive supporting portion located on the non-display side of the display panel;
    a second conductive supporting portion located on a side of the first conductive supporting portion away from the display panel;
    a bonding portion between the first conductive supporting portion and the second conductive supporting portion; and
    a conductive connecting portion for electrically connecting the first conductive supporting portion and the second conductive supporting portion, wherein the conductive connecting portion includes conductive glue, and wherein an applied amount of the conductive glue satisfies:

$$v \leq D*S \leq V \text{ and } S=(\rho_{after}-\rho_{before})/\rho_{after}\times 100\%,$$

wherein v is a volume of the first opening, wherein V is a sum of the volumes of the first opening and the second opening, wherein D is the applied amount of conductive adhesive, wherein $\rho_{after}$ represents a density of the conductive adhesive after curing, and wherein $\rho_{before}$ represents a density of the conductive adhesive before curing.

2. The display device according to claim 1, wherein the bonding portion is conductive, and wherein the bonding portion and the conductive connecting portion are a same component.

3. The display device according to claim 2, wherein the bonding portion comprises a conductive adhesive.

4. The display device according to claim 1, wherein the bonding portion is non-conductive, and wherein the conductive connecting portion comprises a first portion located between the first conductive supporting portion and the second conductive supporting portion.

5. The display device according to claim 4, wherein the bonding portion has a first opening, and wherein the first portion of the conductive connecting portion is located in the first opening.

6. The display device according to claim 5, wherein the second conductive supporting portion has a second opening, wherein a projection of the second opening on the first conductive supporting portion overlaps with a projection of the first opening on the first conductive supporting portion, and wherein the conductive connecting portion further comprises a second portion located in the second opening.

7. The display device according to claim 6, wherein the first opening has a first dimension along a direction parallel to the first conductive supporting portion, wherein the second opening has a second dimension along the direction parallel to the first conductive supporting portion, and wherein the first dimension is greater than the second dimension.

8. The display device according to claim 1, wherein the second conductive supporting portion comprises a first sub-supporting portion and a second sub-supporting portion spaced apart from each other, wherein the conductive connecting portion comprises a first sub-connecting portion and a second sub-connecting portion spaced apart from each other, wherein a projection of the first sub-connecting portion on the first supporting portion overlaps with a projection of the first sub-supporting portion on the first supporting portion, and wherein a projection of the second sub-connecting portion on the first supporting portion overlaps with a projection of the second sub-supporting portion on the first supporting portion.

9. The display device according to claim 8, wherein the display device is a foldable display device, and wherein a folding axis of the display device is located in a gap between the first sub-supporting portion and the second sub-supporting portion.

10. The display device according to claim 8, further comprising a circuit board disposed on a side of at least one sub-supporting portion of the first sub-supporting portion and the second sub-supporting portion away from the first supporting portion, wherein a ground terminal of the circuit board is coupled to the at least one sub-supporting portion.

11. The display device according to claim 7, wherein the display panel comprises a first sub-part and a second sub-part, wherein the first conductive supporting portion is provided on the first sub-part, wherein the second sub-part is bent toward the non-display side, and wherein an end of the second sub-part away from the first sub-part is electrically coupled to the circuit board.

12. The display device according to claim 10, wherein a material of the first conductive supporting portion and a material of the second conductive supporting portion comprise metal.

13. The display device according to claim 12, wherein the material of the first conductive supporting portion comprises at least one of steel and steel aluminum alloy, and wherein the material of the second conductive supporting portion comprises at least one of copper and copper alloy.

14. The display device according to claim 1, wherein the bonding portion comprises a pressure sensitive adhesive.

15. The display device according to claim 2, wherein the bonding portion comprises a pressure sensitive adhesive.

16. The display device according to claim 3, wherein the bonding portion comprises a pressure sensitive adhesive.

17. The display device according to claim 4, wherein the bonding portion comprises a pressure sensitive adhesive.

18. The display device according to claim 5, wherein the bonding portion comprises a pressure sensitive adhesive.

19. The display device according to claim 6, wherein the bonding portion comprises a pressure sensitive adhesive.

* * * * *